(12) United States Patent
Quiroga

(10) Patent No.: US 7,756,231 B2
(45) Date of Patent: Jul. 13, 2010

(54) DIGITAL CLOCK GENERATING CIRCUIT AND METHOD OF OPERATION

(75) Inventor: Emilio J. Quiroga, Lake Worth, FL (US)

(73) Assignee: Freescale Semiconductor, Inc., Austin, TX (US)

( * ) Notice: Subject to any disclaimer, the term of this patent is extended or adjusted under 35 U.S.C. 154(b) by 782 days.

(21) Appl. No.: 11/621,420

(22) Filed: Jan. 9, 2007

(65) Prior Publication Data

US 2008/0165753 A1 Jul. 10, 2008

(51) Int. Cl.
*H04L 7/00* (2006.01)
*H04B 7/216* (2006.01)

(52) U.S. Cl. .................................. 375/354; 370/342
(58) Field of Classification Search .............. 370/342; 327/291; 375/354
See application file for complete search history.

(56) References Cited

U.S. PATENT DOCUMENTS 6,990,041 B2   1/2006  Johnson et al.
6,990,122 B2*  1/2006  Guinea et al. .............. 370/518
2006/0045215 A1* 3/2006  Ballantyne et al. ......... 375/344
2006/0047459 A1* 3/2006  Underbrink et al. ........ 702/117

* cited by examiner

*Primary Examiner*—David C Payne
*Assistant Examiner*—Brian J Stevens

(57) ABSTRACT

A digital clock generation circuit (200) and method of operation (400). A digital clock (250) produces an output (220) with a first frequency or a second frequency. A clock control circuit (204, 206) selectively sets the digital clock (250) to produce either the first frequency or the second frequency. An excess pulse counter (212) determines a number of pulses produced by the digital clock (250) at the second frequency that differs in the number of pulses that would have been produced at the first frequency, had the clock frequency change to the second frequency not occurred. An output phase correction circuit (230, 232, 212) removes, in response to the digital clock (250) changing from producing the second frequency to producing the first frequency, the number of pulses from the output (220) that were counted by the excess pulse counter (212).

16 Claims, 6 Drawing Sheets

DIGITAL CLOCK GENERATING CIRCUIT AND METHOD OF OPERATION

CROSS-REFERENCE TO RELATED APPLICATION(S)

None.

BACKGROUND

1. Field

This disclosure relates generally to generating electronic timing signals, and more specifically, to generating timing signals with changeable frequencies to control digital processing circuits.

2. Related Art

Reference clock generators produce timing signals that are used to clock the operation of digital circuits. Some devices incorporating digital circuits operate in different modes and each mode may have its unique processing requirements. In some applications, different modes operate more beneficially if a reference clock frequency is changed based upon a current mode of a device. One example of such a device is a wireless communications device that is able to process multiple types of wireless communications signals. Digital processing circuits for one type of signal may operate more efficiently if a variable reference clock generator is provided to change the reference clock frequency based upon the current mode of the device. Some devices benefit from reference clock generators that are able to change their output frequency but maintain phase synchronization when they return to their original output frequency.

Applications that benefit from variable reference clock generators that maintain phase synchronization include circuits that perform processing of signals with circuits based on a first clock frequency and that are desired to remain in synchronization with input signals during a time that the reference clock frequency is shifted to a second clock frequency.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
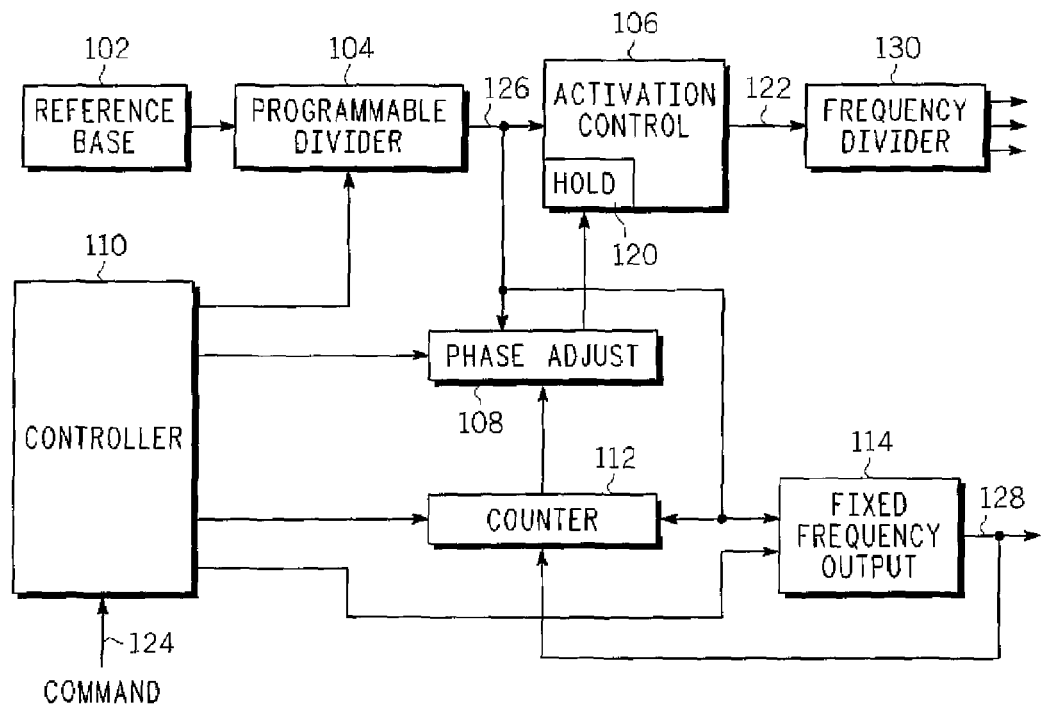
FIG. 1 illustrates a block diagram of a reference clock generator in accordance with one embodiment of the present invention.

FIG. 1 illustrates a block diagram of a reference clock generator 100 in accordance with one embodiment of the present invention. The reference clock generator 100 generates several reference clock signals that are used to time operation of digital circuits. The frequencies of some reference clock signals generated by the reference clock generator 100 are used to generate other reference clock signals that have different frequencies, such as by dividing the frequency of some reference clock signal frequencies by constant integers to generate lower frequency reference clock signals as are required by various processing stages of digital circuits receiving these reference clock signals.

The reference clock generator 100 is able to generate some reference clock signals that typically operate at a first frequency but are able to be shifted to a second frequency as may be required for proper processing by digital circuits that are using the output of the reference clock generator as a reference clock. One example is a case of reference clock signals shifting from the first frequency to the second frequency for a period of time and then returning to the first frequency. After the reference clock signal returns to the first frequency, the operation of the reference clock generator 100 removes pulses from the output of the reference clock signals to maintain phase synchronization of the output of the first reference frequency.

In the context of the present disclosure, and consistent with a provided example, maintaining phase synchronization of the reference clock output when transferring to a higher second frequency is an operation that removes pulses from the reference clock signals such that the pulses that were produced at the second frequency that were in excess of pulses that would have been produced at the first frequency are removed from the reference clock output. Maintaining phase synchronization results in producing a total number of clock pulses after a correction that is equal a number of pulses that would have occurred if the reference clock signal had not changed frequency and had continued to operate at the first frequency instead of changing to the second frequency.

Applications that benefit from variable reference clock generators that maintain phase synchronization include circuits that perform processing of signals with circuits based on the first clock frequency and that are desired to remain in synchronization with, for example, input signals during the time that the reference clock frequency is shifted to the second clock frequency. In such an application, adjusting the total number of clock pulses to equal the number of clock pulses that would have occurred if the reference clock frequency had not been shifted to the second clock frequency allows such synchronization to occur.

The reference clock generator 100 includes a reference base 102. Reference base 102 is typically a very high frequency oscillator that generates a base reference signal that is divided in frequency by various processing blocks to produce reference clock signals at various frequencies. These reference clock signals typically have frequencies that are equal to the frequency of the reference base 102 divided by an integer.

The reference clock generator 100 includes a controller 110 that controls the proper operation of the various components of the reference clock generator 100. The controller 110 accepts commands 124 from external control elements that configure and/or dynamically control the reference clock generator 100 for proper operation.

The reference clock generator 100 includes a programmable divider 104 that is able to be configured to divide the frequency of the output of the reference base 102 by a configurable integer as controlled by the controller 110. The programmable divider 104 of one embodiment allows the integer by which the frequency of its input is divided to be changed during normal operation without interruption of the output of the programmable divider 104. The programmable divider 104 produces a frequency divided output 126 that is based upon the frequency of the output of the reference base 102 and divided by a configurable, or programmable, integer as set under selection by the controller 110. The ability to change the integer by which the output of the reference base 102 is divided during operation allows the frequency divided output 126 to change frequency at will and provides an ability to change the frequency of the reference clock output to support different processing requirements with the same reference clock generator 100, thereby saving circuit complexity and potential power consumption.

The reference clock generator 100 includes a clock activation control stage 106 that accepts the frequency divided output 126 and produces a reference output 122. Clock activation control stage 106 of one embodiment has a hold input 120 that accepts a hold input to inhibit clock pulses produced by the clock activation control stage 106. The hold input 120 accepts a control signal from a phase adjuster 108 that operates to determine how pulses of the output stage should be removed to, for example, maintain phase synchronization of an output of the reference clock generator 100 after a frequency shift of that output, an example of which is described in detail below.

The reference output 122 of one embodiment is provided to various other frequency dividing circuits 130 to produce various reference clock frequencies as are required by various digital processing stages. A fixed frequency output circuit 114 of one embodiment is controlled by controller 110 to divide a frequency of the reference output 122 by a configurable integer such that a fixed frequency output 128 is produced while the reference output 122 is at either the first frequency or the second frequency. The fixed frequency output circuit 114 provides the fixed frequency output 128, which is a constant reference frequency that is able to drive common processing circuits regardless of the frequency of the reference output 122. This constant reference frequency operates at a slower rate than either the first or second frequencies.

The reference clock generator 100 includes a phase adjuster 108 and a counter 112 that determine how many pulses should be removed from the output of the reference clock generator 100. The phase adjuster 108 and counter 112 operate as an output phase correction circuit that adds or removes, in response to the output of the programmable divider 104 changing from producing an output at the second frequency to producing an output at the first frequency, a number of pulses from the output that were counted, which differ from the number of pulses that would have been produced at the first frequency. In one embodiment, the counter 112, under control of controller 110, is configured to count pulses of the reference output 122 while the reference clock generator 100 is temporarily producing the reference output at a higher second clock frequency. Once the reference output 122 is returned to the first clock frequency, the phase adjuster 108 operates to assert the hold input 120 of the clock activation control stage 106 to cause pulses to be removed from the reference signal 122 to correct the phase of the reference output 122 in response to phase shifts that occurred during the temporary shift of the reference output 122 to the second frequency. The operation of the phase adjuster 108 and counter 112 of one embodiment is described in detail below. In further embodiments of the present invention, counter 112 is able to accept the fixed frequency output 128 in order to determine a period over which the reference output 122 is operating at the second frequency and thereby determine how many pulses are to be removed from the reference output 122 after that signal returns to the first frequency.

The counter 112 records the number of either added or removed clock pulses that occur when the frequency generator is operating at the second clock frequency. In one embodiment, it is updated at the fixed frequency output period, and the update is either additive or subtractive, based on whether the second clock frequency is higher or lower than the first frequency, respectively.

Figure 2:
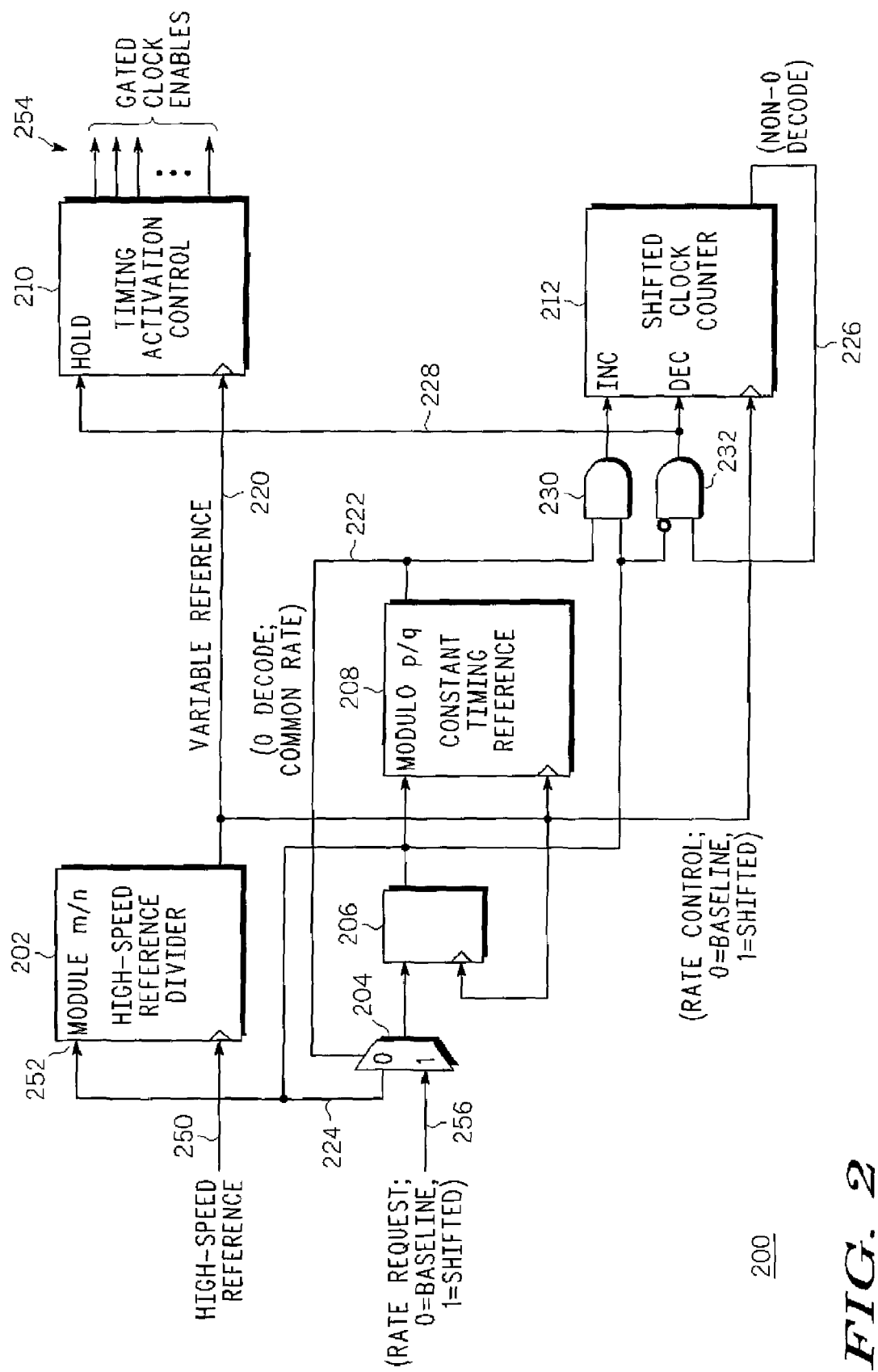
FIG. 2 illustrates a block diagram of a phase synchronous reference clock generator in accordance with one embodiment of the present invention.

FIG. 2 illustrates a block diagram of a phase synchronous reference clock generator 200 in accordance with one embodiment of the present invention. The phase synchronous reference clock generator 200 accepts a high speed reference 250 that is provided to a high-speed reference divider 202. The high speed reference 250 operates as a digital clock that is configured to produce an output at one of a first frequency and a second frequency where the second frequency is different from the first frequency. The high-speed reference divider 202 accepts a modulo control signal (modulo_cntl) 252 that controls changing the integer by which the high-speed reference 250 is divided. The integer of one embodiment used by the high-speed reference divider is selected between m and n. The high speed reference divider 202 produces a variable reference 220 that has a frequency equal to the high-speed reference 250 divided by one of two integers, as is controlled by the modulo_cntl 252. The variable reference 220 is provided to a timing activation control circuit 210 that produces various timing reference signals 254 to be provided to various digital processing circuits receiving reference signals from the phase synchronous reference clock generator 200.

The phase synchronous reference clock generator 200 includes a control gate 204 and a latch 206. The gate 204 of one embodiment is implemented as a 2:1 multiplexer and the latch 206 is realized as a standard sequential register, such as a D-flip-flop. The selection of the output of the gate 204 is timed by the constant timing reference 222, such that the latch 206 is updated only at the timing interval defined by the constant timing reference. This alleviates the phase synchronous reference clock generator 200 from precisely aligning rate request changes to the timing of the high speed reference 250. By updating rate request changes only at the constant timing reference rate, the recording of pulse differences (between the first and second frequencies) is assured to remain an integer value. The control gate 204 and latch 206 operate as a clock control circuit that controls the high speed reference divider 202 and selectively sets the high speed reference divider 202 to produce an output at one of the first frequency and the second frequency. The control gate 204 accepts an input 256 that controls the frequency of the variable reference 220. When the input 256 is in a low state, the variable reference 220 is at the first, baseline frequency. When the input 256 is high, the variable reference 220 is at the second frequency. Gate 204 and latch 206 operate to properly condition the input 256 to produce a modulo_cntl signal 224 that indicates the frequency to be produced by the high speed reference divider 202.

A constant timing reference 208 receives the variable reference 220 and the modulo_cntl signal 224 in order to produce a constant frequency clock signal 222. The constant timing reference 208 includes configurable frequency dividers to divide the frequency of the variable reference 220 by an integer based upon the current frequency of the variable reference 220 as indicated by the modulo_cntl signal 224 signal. In one embodiment, the configurable frequency dividers divide the variable reference by an integer value of either p or q. In one embodiment the product of q and n, where n is the divider used by the high-speed reference divider 202 to produce the first frequency, is equal to the value of the product of p and m, where m is the divider used by the high-speed reference divider 202 to produce the first frequency. The constant frequency clock signal 222 of the phase synchronous reference clock generator 200 is used to control clock phase synchronization in response to shifts in frequency of the variable frequency reference.

In one embodiment, the constant timing reference 208 is configured to produce a constant frequency clock signal 222 that has a pulse period equal to the period in which the second frequency of the variable reference 220 produces one additional pulse relative to the first frequency of the variable reference 220. This configuration allows pulses of the constant timing reference to be counted during the period in which the variable reference 220 is operating at the higher second frequency. In this manner, the value of that count when the variable reference 220 returns from the second frequency to the first frequency is the number of pulses that must be removed from the reference clock output to maintain phase synchronization.

The high-speed reference divider 202 accepts the high speed reference 250, which is a reference base clock input, at a reference frequency. The high-speed reference divider 202 produces an output at the first frequency by dividing the reference frequency by a first integer and produces the output at the second frequency by dividing the reference frequency by a second integer. The constant timing reference 208 produces a fixed frequency output by dividing, when the output is produced at the first frequency, the frequency of the variable reference 220 by a first factor, which is an integer in one embodiment, and by dividing, when the output is produced at the second frequency, the frequency of the variable reference 220 by a second factor, which is an integer in one embodiment. The value of the first integer multiplied by the first factor is equal to the second integer multiplied by the second factor. The shifted clock counter 212 of one embodiment is configured to operate at a modulo rate defined by the first integer, i.e., the shifted clock counter 212 counts up to one less than the first integer and resets in response to exceeding a count of one less than the first integer.

In one embodiment, the high speed reference divider 202 accepts a high speed reference and divides the frequency of that reference by thirteen (13) to obtain the first frequency and divides the frequency of that reference by twelve (12) to obtain the second frequency. The constant timing reference 208 accepts the variable reference 220 and divides the frequency of the variable reference 220 by twelve (12) when the variable reference is operating at the first frequency and divides the frequency of the variable reference 220 by thirteen (13) when the variable reference 220 is operating at the second frequency. In this manner, the output of the constant timing reference 208 is not affected by the frequency of the variable reference 220. Further, the frequency of the constant timing reference 208 output is such when the variable reference is operating at the second frequency, one pulse is produced by the constant timing reference 208 for each pulse produced in the variable reference 220 at the second frequency that exceeds the number of pulses that would have been produced at the first frequency. These pulses are then able to be easily counted by a counter to determine the number of pulses that are required to be removed from the variable reference output to maintain phase synchronization once the variable reference returns to operating at the first frequency.

The phase synchronous reference clock generator 200 includes a shifted clock counter 212. The shifted clock counter 212 of one embodiment operates as an excess pulse counter and determines a number of pulses produced in the variable reference 220 at the second frequency that exceed pulses that would have been produced in the variable reference 220 at the first frequency. The shifted clock counter 212 accepts the variable reference as a clock for a gated counter circuit that is able to be configured to either increment or decrement by an integer value in response to a clock input. The shifted clock counter 212 has an increment port that accepts an input from an increment gate 230. Increment gate 230 provides a pulse to the increment port of the shifted clock counter 212 in response to an assertion of the constant timing reference 208 and the modulo_cntl signal 224. In one example of this embodiment, this causes the shifted clock counter to increment one count for each pulse of the constant frequency clock signal 222. As described above, the constant frequency clock signal 222 produces one pulse for each pulse that is to be removed from the variable reference 220 to maintain phase synchronization.

The shifted clock counter 212 produces a non-zero decode output 226. The nonzero decode output 226 is asserted when the value of the shifted clock counter is not zero. The shifted clock counter 212 further has a decrement port that accepts an input from a decrement gate 232. The decrement gate 232 provides a pulse in response to the de-assertion of the modulo_cntl signal 224 and an assertion of the non-zero decode output 226. In one example of this embodiment, when the variable reference 220 is configured to produce the second frequency, the shifted clock counter will decrement once for every pulse that is to be removed from the variable reference 220 after the frequency returns to the first frequency. Once the phase synchronous reference clock generator 200 is commanded, by input 256, to return to the first frequency, the modulo_cntl signal 224 is de-asserted and the non-zero decode 226 is asserted since there is a non-zero count on the shifted clock counter 212. In response to the assertion of the output of the decrement gate 232, the shifted clock counter will decrement once for each additional output pulse of the variable reference 220 that had been produced while operating at a higher second frequency.

The output of the decrement gate 232 is also provided to a hold input of the timing activation control circuit 210. Assertion of the hold input of the timing activation control circuit 210 results in inhibiting a response to pulses of the variable reference 220 and causes the timing activation control circuit 210 to remove those pulses from the pulse train prior to their driving the other circuits of the timing activation control circuit 210. This hold input is asserted for the period that the shifted clock counter 212 has a non-zero count, and therefore is asserted for the number of clock pulses that are to be removed from the variable reference 220 to maintain phase synchronization.

The combination of the increment gate 230 and the decrement gate 232 causes the shifted clock counter 212 to increment by an integer number in response to 1) determining a pulse of the variable reference 220, when the variable reference 220 is operating at the second frequency, exceeds an integer number of pulses that would have been produced by the digital clock at the first frequency, and 2) determining that the latch 206 has set the high speed reference divider 202 to produce the variable reference 220 at the second frequency that is faster than the first frequency. Likewise, the combination of the increment gate 230 and the decrement gate 232 causes the shifted clock counter 212 to decrement by an integer number in response to 1) determining a pulse of the variable reference 220, when the variable reference 220 is operating at the second frequency, is deficient by an integer number of pulses that would have been produced by the digital clock at the first frequency, and 2) determining that the latch 206 has set the high speed reference divider 202 to produce the variable reference 220 at a second frequency that is slower than the first frequency. The combination of the increment gate 230 and the decrement gate 232 causes the shifted clock counter 212 to adjust in response to the clock latch 206 having set the high speed reference divider 202 to produce the variable reference 220 at the first frequency and determining that the shifted clock counter has a non-zero count.

Figure 3:
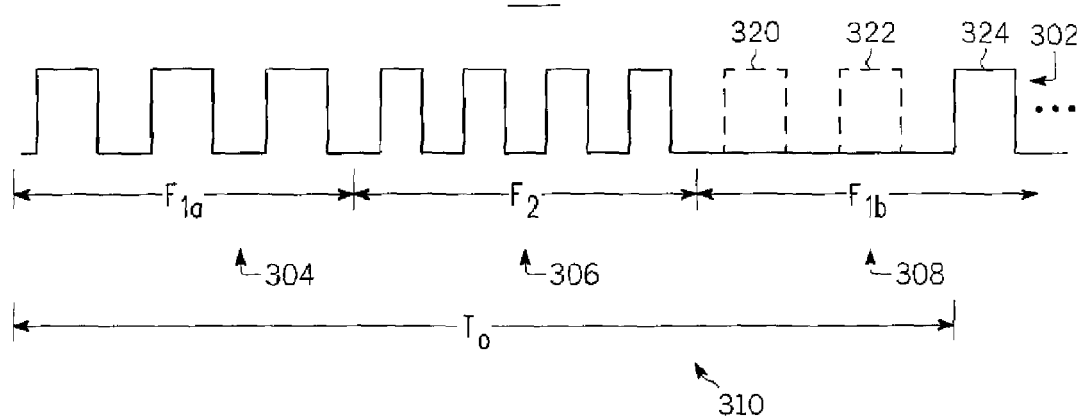
FIG. 3 illustrates a phase synchronized pulse train timing diagram, as produced in accordance with one embodiment of the present invention.

FIG. 3 illustrates a phase synchronized pulse train timing diagram 300, as produced in accordance with one embodiment of the present invention. The phase synchronized pulse train timing diagram 300 shows a pulse train 302 that corresponds to a variable reference 220 described above. The pulse train 302 has three intervals of interest. A first interval of interest 304 occurs during an interval $F_{1a}$ and is an initial interval where the clock output pulse train 302 has a first frequency. A second interval of interest 306 occurs during an interval $F_2$ and is an interval where the clock output pulse train 302 has a second frequency. A third interval of interest 308 occurs during an interval $F_{1b}$ and is an interval where the clock output pulse train 302 has returned to the first frequency but has had pulses removed to maintain phase synchronization.

As one example of this embodiment, the second interval of interest shows the pulse train 302 has shorter pulse periods due to its higher frequency. This results in an excess of pulses being produced during the second period of interest 306. As described above, the processing of one embodiment of the present invention removes pulses from the clock output after the clock output frequency has returned to the first, or original, frequency after having been shifted to a second frequency.

The third interval of interest 308 shows a first removed pulse 320 and a second removed pulse 322. In order to more simply describe the processing of one embodiment of the present invention, this illustration shows the removal of two pulses. It is clear that any number of pulses are able to be removed from the pulse train 302 to maintain phase synchronization. After the first removed pulse 320 and the second removed pulse 322, a first resumed pulse 324 is shown as occurring after the output is re-enabled. The operation of one embodiment of the present invention operates to cause the number of pulses that occurred during the time interval $T_0$ 310, a time interval during which the clock output has produced signals at the first frequency and the second frequency, is the same as if the clock output had only produced signals at the first frequency for the entire time interval $T_0$ 310. This processing allows phase synchronization of the clock output, and processing circuits being driven by the clock output, after the temporary shift of the frequency of the clock output.

Figure 4:
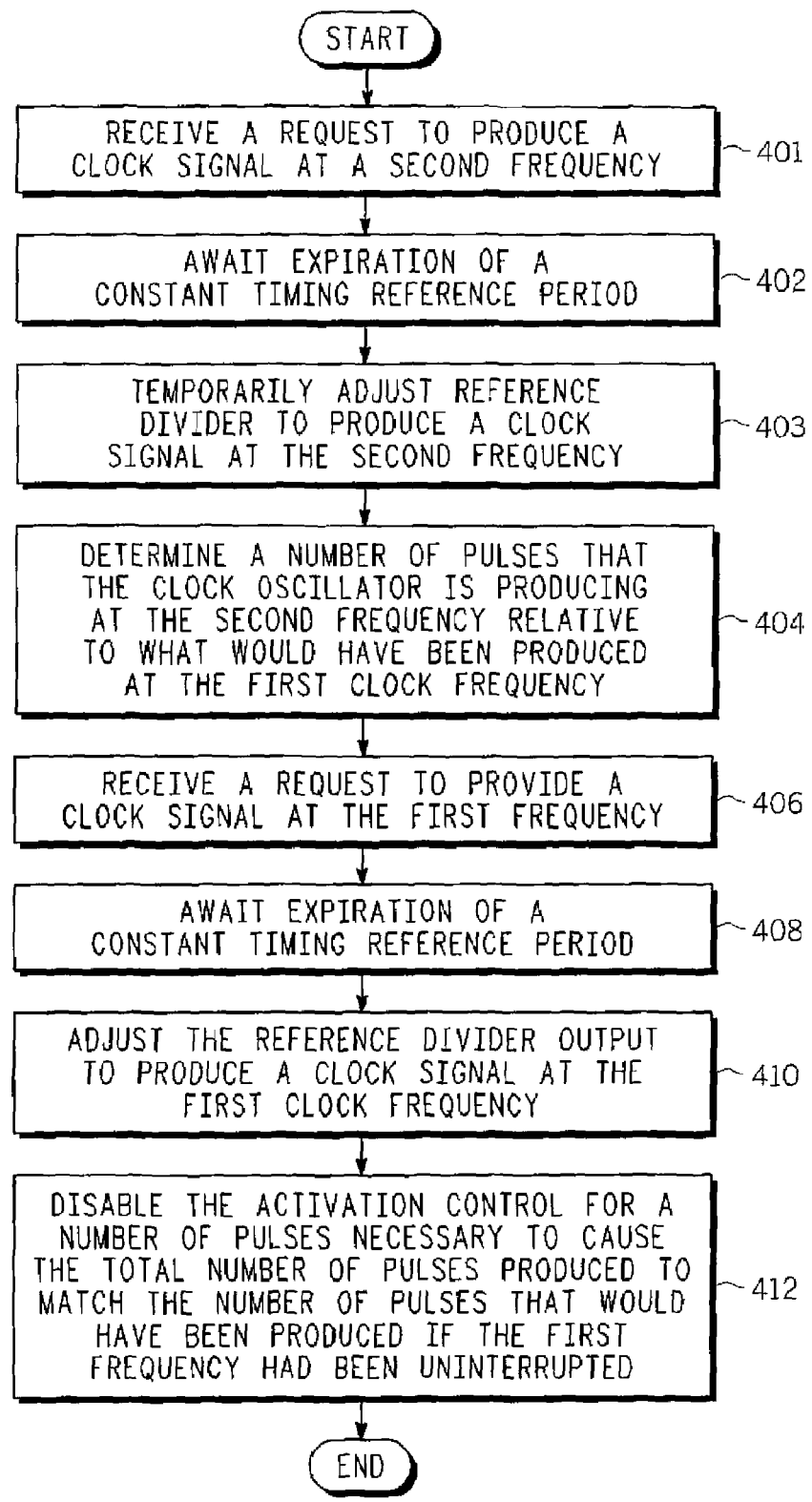
FIG. 4 illustrates a processing flow diagram for a phase adjusted temporary reference clock frequency shift process, in accordance with one embodiment of the present invention.

FIG. 4 illustrates a processing flow diagram for a phase adjusted temporary reference clock frequency shift process 400, in accordance with one embodiment of the present invention. The phase adjusted temporary reference clock frequency shift process 400 begins by receives, at step 401, a request to produce a clock signal at a second frequency. This request is postponed by awaiting, at step 402, expiration of a constant timing reference period. This postpones the request until the output of the constant timing reference is produced in order to allow the clock generator to maintain a record of the time the system will operate at the second frequency. Postponing until the expiration of the constant timing reference period allows an integer number of pulses to be compensated.

The constant timing reference activation then temporarily adjusts, at step 403, a reference divider output to produce a clock signal at a second frequency. This adjustment is made after the reference divider output has been producing a clock signal at a first clock frequency. In one embodiment, the second clock frequency is higher than the first clock frequency. One embodiment performs this adjustment by changing an integer by which a reference base signal is divided to produce the clock oscillator output.

The phase adjusted temporary reference clock frequency shift process 400 continues by determining, at step 404, a number of pulses that the clock oscillator is producing at the second frequency that differ from the number of clock pulses that would have been produced at the first clock frequency.

The processing continues by receiving, at step 406, a request to produce a clock signal at the first frequency. This request is postponed by awaiting, at step 408, expiration of a constant timing reference period. The postponing of the request operates in a manner similar to that described above.

The phase adjusted temporary reference clock frequency shift process 400 proceeds to adjust, at step 410, the clock oscillator output to the first clock frequency. In one embodiment, this adjustment is performed by changing the integer by which the reference base signal is divided to produce the clock oscillator output. This integer is the integer that was used prior to temporarily adjusting the clock oscillator to produce the clock signal at the second frequency.

The phase adjusted temporary reference clock frequency shift process 400 disables, at step 412, the clock oscillator output for a number of pulses that corresponds to a number of pulses that the second frequency produced in relative to the number of pulses that would have been produced if the first frequency had been produced without the above implemented shift.

Figure 5A:
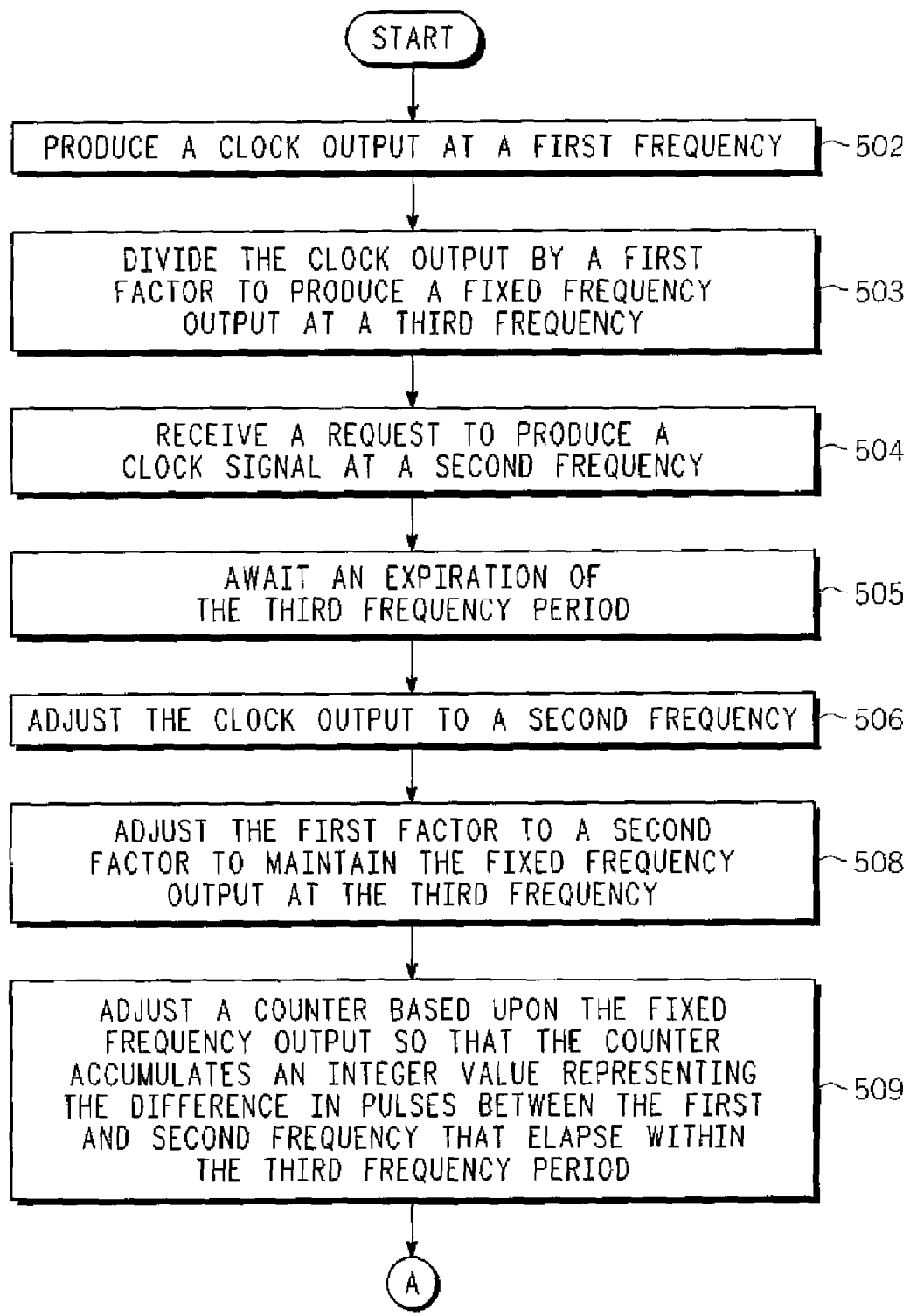
FIGS. 5A and 5B illustrate a processing flow diagram for a temporary reference clock frequency shift phase adjustment process, in accordance with one embodiment of the present invention.
Figure 5B:
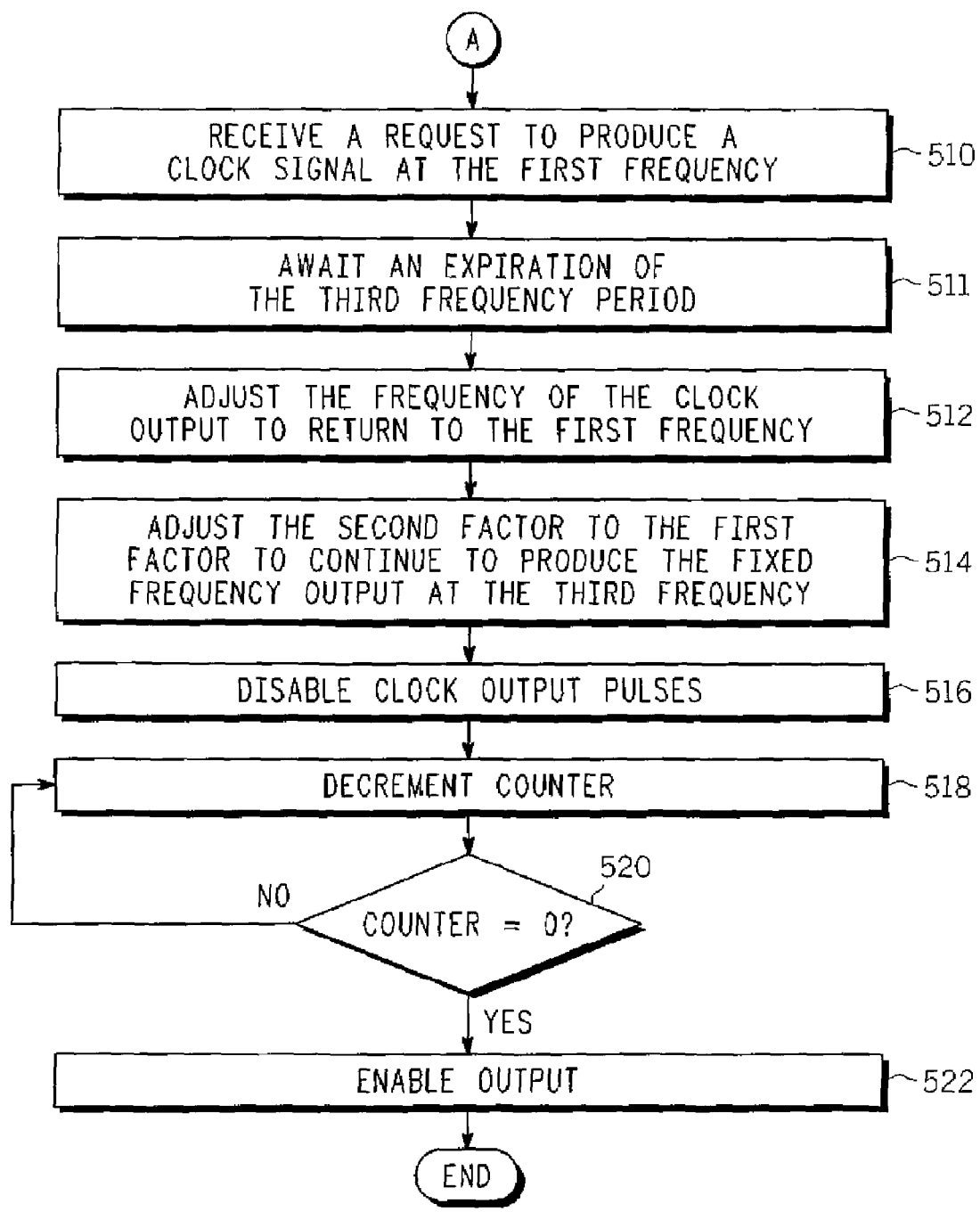

FIGS. 5A and 5B illustrate a processing flow diagram for a temporary reference clock frequency shift phase adjustment process 500, in accordance with one embodiment of the present invention. The temporary reference clock frequency shift phase adjustment process 500 describes a more detailed process to temporarily shift a reference clock output from a first frequency to a second frequency, where the second frequency is higher than the first frequency. The temporary reference clock frequency shift phase adjustment process 500 includes generation of a third frequency clock signal that produces one pulse for each pulse generated at the second frequency that is in excess of pulses that would have been generated by the first frequency.

The temporary reference clock frequency shift phase adjustment process 500 begins by producing, at step 502, a clock output at a first frequency. The temporary reference clock frequency shift phase adjustment process 500 continues by dividing, at step 503, the clock output by a first factor to produce a fixed frequency output at a third frequency The third frequency is lower than the first frequency and the second frequency. The third frequency in one embodiment produces one pulse for each pulse generated by the clock oscillator at the second frequency that is in excess of the number of pulses that would have been generated by the clock oscillator output at the first frequency.

The processing continues by receiving, at step 504, a request to produce a clock signal at a second frequency. This request is postponed by awaiting, at step 505, for an expiration of a constant timing reference period. This postpones the request until the output of the constant timing reference is produced in order to allow the clock generator to maintain a record of the time the system will operate at the second frequency. Postponing until the expiration of the constant timing reference period allows an integer number of pulses to be compensated.

The temporary reference clock frequency shift phase adjustment process 600 continues by adjusting, at step 506, the clock output to a second frequency that is higher that the first frequency. In response to adjusting the clock output to the second frequency, the processing adjusts, at step 508, the first factor to a second factor in order to maintain the fixed frequency output at the third frequency. In one embodiment, the adjustment of the frequency of the clock output and the adjustment of the first factor to a second factor is performed in a synchronous manner. For example, one embodiment uses a counter based frequency divider to generate the fixed frequency output and the frequency of the clock output and adjustment of the first factor are performed at the time that the counter based frequency divider reaches its terminal count.

The temporary reference clock frequency shift phase adjustment process 500 continues by adjusting, at step 509, a counter based upon the fixed frequency output so that the counter accumulates an integer value representing the difference in pulses between the first and second frequency that elapse within the third frequency period.

The processing continues by receiving, at step 510, a request to produce a clock signal at a first frequency. This request is postponed by awaiting, at step 511, for an expiration of a constant timing reference period. This postpones the request until the output of the constant timing reference is produced in order to allow the clock generator to maintain a record of the time the system will operate at the first frequency. Postponing until the expiration of the constant timing reference period allows an integer number of pulses to be compensated.

The temporary reference clock frequency shift phase adjustment process 500 continues by adjusting, at step 512, the frequency of the clock output to return back to the first frequency. The temporary reference clock frequency shift phase adjustment process 500 continues by adjusting, at step 514, second factor back to the first factor to produce the fixed frequency output at the third frequency. In one embodiment, these updates are also performed synchronously in a manner similar to that described above.

The temporary reference clock frequency shift phase adjustment process 500 continues by disabling, at step 516, the clock output for a number of pulses that were produced at the second frequency that exceed the number of pulses that would have been produced at the first clock frequency. The temporary reference clock frequency shift phase adjustment process 500 further decrements, at step 518, the counter for each pulse of the clock output that is not produced due to the above disabling.

The temporary reference clock frequency shift phase adjustment process 500 determines, at step 520, if the counter has reached a zero count. If the counter has not reached a zero count, the processing returns to decrementing, at step 518, the counter for each pulse of the clock output that is removed and therefore not produced. If the counter has reached a zero count, the processing enables, at step 522, the clock output and the temporary reference clock frequency shift phase adjustment processing terminates.

Figure 6:
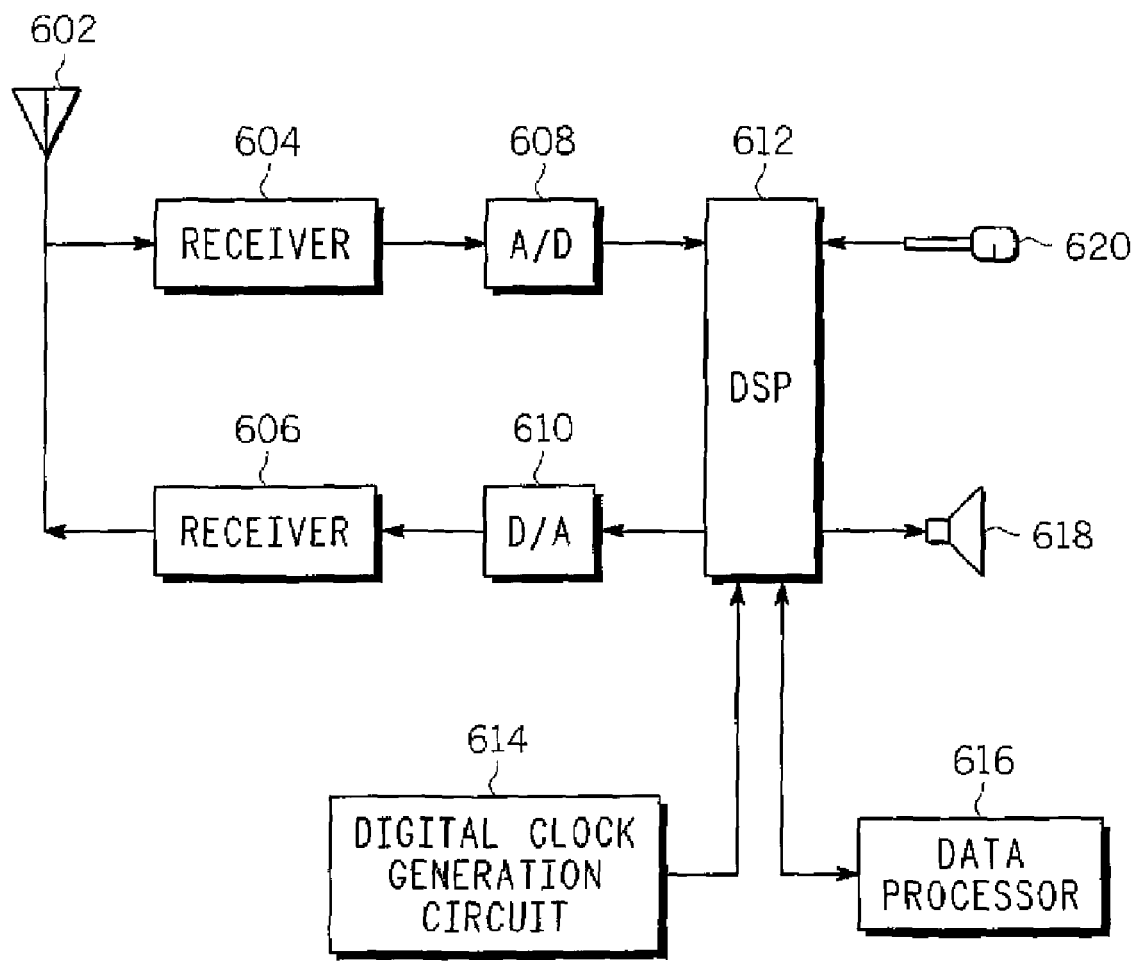
FIG. 6 illustrates a wireless communications device in accordance with one embodiment of the present invention.

FIG. 6 illustrates a wireless communications device 600 in accordance with one embodiment of the present invention. The wireless communications device 600 includes an antenna 602 that provides a received wireless signal to a receiver 604. The antenna 602 also accepts radio signals from transmitter 606 to be wirelessly transmitted through the antenna 602 to remote devices.

The receiver 604 processes received wireless signals as required to provide a suitable signal to an analog to digital converter (A/D) 608. The analog to digital converter 608 digitizes the received signals and provides a digitized, discrete time representation of selected received signals to a digital signal processor (DSP) 612. DSP 612 performs the necessary processing of the digitized signals to produce user data to provide to a data processor 616 or to produce audio signals to provide to speaker 618 for amplification and reproduction. Data processor 616 of one embodiment includes, for example, a data processor as found in a personal digital assistant, smartphone, or any other suitable wireless computing device.

The digital signal processor 612 of one embodiment further accepts sound input from a microphone 620. The DSP 612 is also able to accept user data from a data processor 616. DSP 612 performs the processing required to prepare audio signals and/or user data for transmission through transmitter 606 and antenna 602.

The DSP 612 accepts reference clock signals from a digital clock generation circuit 614. As described above, the digital clock generation circuit 614 is able to generate fixed frequency reference signals as well as variable frequency reference signals that can be set to have one of two pre-defined frequencies. The DSP 612 of one embodiment includes two specialized sub-circuits in addition to various other processing circuits to perform the processing required by the wireless communications device. A first specialized circuit operates with a reference clock signal at a first frequency and is used to processes certain types of received signals in some modes of operation. A second specialized circuit operates with a reference clock signal at a second frequency and is used to process other types of received signals in other modes of operation.

The wireless communications device 600 of one embodiment is able to transmit and/or receive data by using one or more suitable wireless broadcast techniques and/or standards. For example, one embodiment includes wireless communications devices 600 that are able to communicate by using either the General System for Mobile (GSM) communications standard or the Wideband Code Division Multiple Access (W-CDMA) communications standard.

In one embodiment, the first specialized circuit processes W-CDMA signals as is required to extract data and/or voice data bearing signals carried by W-CDMA carriers or to produce W-CDMA compliant waveforms for transmission. The second specialized circuit processes GSM signals or produces GSM compliant waveforms for transmission. When operating in a W-CDMA mode, the digital clock generation circuit 614 produces a reference clock signal at the first frequency. When processing GSM signals, the digital clock generation circuit 614 produces a reference clock signal at the second frequency.

One embodiment of the present invention is incorporated into wireless communications devices 600 that operate in both GSM and W-CDMA modes. Such wireless communications devices 600 operate in a W-CDMA mode but temporarily switch to GSM operation during a compression mode gap. The operation of the digital clock generation circuit 614 allows the DSP 612 to operate in W-CDMA mode with a clock reference signal at the first frequency and then switch to GSM processing with the digital clock generation circuit 614 temporarily changing to the second frequency. After temporarily processing GSM signals, the wireless communications device 600 returns back to having the DSP 612 processing W-CDMA signals and having the digital clock generation circuit 614 return to the first frequency. As described above, upon returning back to the first frequency, the digital clock generation circuit 614 maintains reference clock signal phase synchronization and thereby facilitates maintaining synchronization to the received W-CDMA signal and synchronization of internal processing of the DSP 612.

Although the invention is described herein with reference to specific embodiments, various modifications and changes can be made without departing from the scope of the present invention as set forth in the claims below. For example, various analog to digital conversion circuits are able to incorporate the feedback timing described herein. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A digital clock generation circuit, comprising:
    a digital clock configurable to produce an output at either one of a first frequency and a second frequency, the second frequency being different from the first frequency;
    a clock control circuit controlling the digital clock and selectively setting the digital clock to produce the output at one of the first frequency and the second frequency;
    an excess pulse counter, communicatively coupled to the clock control circuit and the digital clock, the excess pulse counter determining a number of pulses produced by the digital clock at the second frequency that differs from the number of pulses that would have been produced by the digital clock at the first frequency;
    an output phase correction circuit, communicatively coupled to the digital clock, the excess pulse counter, and the clock control circuit, the output phase correction circuit removing, in response to the clock control circuit commanding the digital clock to change from producing an output at the second frequency to producing an output at the first frequency, the number of pulses from the output that were counted by the excess pulse counter; and
    a fixed frequency clock producing a fixed frequency output at a third frequency,
    wherein the digital clock accepts a reference base clock input at a reference frequency,
    wherein the digital clock produces the output at the first frequency by dividing the reference frequency by a first integer and produces the output at the second frequency by dividing the reference frequency by a second integer, and
    wherein the fixed frequency clock produces the fixed frequency output by dividing, when the output is produced at the first frequency, a frequency of the output by a first factor and by dividing, when the output is produced at the second frequency, the frequency of the output by a second factor, the value of the first integer multiplied by the first factor being equivalent to the second integer multiplied by the second factor.

2. The digital clock generation circuit of claim 1, wherein the output phase correction circuit disables the output for the number of pulses.

3. The digital clock generation circuit of claim 1, further comprising:
    at least one of a receiver and a transmitter;
    a digital signal processing circuit comprising at least one circuit operating at a first frequency and at least one circuit operating at a second frequency; and
    a clock output stage, communicatively coupled to the output phase correction circuit and the digital signal processing circuit, adapted to providing, to the digital signal processing circuit, the output with the number of pulses removed.

4. The digital clock generation circuit of claim 1, wherein the excess pulse counter counts up to one less than the first integer and resets in response to exceeding a count of one less than the first integer.

5. The digital clock generation circuit of claim 1, wherein the excess pulse counter operates by:
    updating a counter by an integer value in response to:
        a pulse produced by the fixed frequency output, and
        setting the digital clock to produce the output at the second frequency, and
    decrementing the counter in response to setting the output to the first frequency and determining that the counter has a non-zero count.

6. The digital clock generation circuit of claim 5, wherein the output phase correction circuit removes one pulse from the output in response to decrementing the counter.

7. The digital clock generation circuit of claim 1, further comprising a constant timing reference, communicatively coupled to the clock control circuit, wherein the constant timing reference is adapted to produce a timing signal with a non-interrupted timing interval that is independent of a frequency of the output generated by the digital clock.

8. The digital clock generation circuit of claim 7, further comprising a shifted clock counter, communicatively coupled to the constant timing reference, wherein the fixed frequency output produces an integer number of pulses to be accumulated by the shifted clock counter, whereby the integer number of pulses represents a number of pulses produced by the digital clock, within the timing interval produced by the constant timing reference, at the second frequency that differ from the number of pulses that would have been produced by the digital clock at the first frequency.

9. A method, with a digital clock generating circuit, for generating a reference clock signal, the method comprising:
    producing an output that is configurable to be at either one of a first frequency and a second frequency, the second frequency being different from the first frequency;
    setting the output to operate at the second frequency,
    determining a number of pulses produced in the output at the second frequency that differs from a number of pulses that would have been produced in the output at the first frequency, within a time period specified by a constant timing reference, and accumulating said number of pulses;
    removing, in response to setting the output to change from the second frequency to the first frequency, the number of pulses accumulated: and
    producing a fixed frequency output at a third frequency,
    wherein producing the output at the first frequency comprises dividing the reference frequency by a first integer and producing the output at the second frequency comprises dividing the reference frequency by a second integer, and wherein producing the fixed frequency output comprises dividing, when the output is produced at the first frequency, a frequency of the output by a first factor and dividing, when the output is produced at the second frequency, the frequency of the output by a second factor, the value of the first integer multiplied by the first factor being equal to the second integer multiplied by the second factor.

10. The method of claim 9, wherein the removing comprises disabling the output for the number of pulses.

11. The method of claim 9, wherein the fixed frequency output produces one pulse for each expiration of a fixed timing reference, the fixed timing reference producing one pulse for each pulse produced in the output at the second frequency that differs from the number of pulses that would have been produced in the output at the first frequency.

12. The method of claim 11, wherein the determining he number of pulses comprises:
- incrementing a counter in response a pulse produced by the fixed frequency output and setting the output to the second frequency, and decrementing the counter in response to the setting the output to the first
- frequency and determining that the counter has a non-zero count.

13. The method of claim 12, wherein the removing comprises removing one pulse from the output in response to decrementing the counter.

14. A digital clock generation circuit, comprising:
- a digital clock configurable to produce an output at either one of a first frequency and a second frequency, the second frequency being different from the first frequency;
- a clock control circuit controlling the digital clock and selectively setting the digital clock to produce the output at one of the first frequency and the second frequency;
- a constant timing reference producing a non-interrupted timing interval that is independent of a frequency being generated by the digital clock generation circuit, the timing interval comprising an integer number of pulses produced by the digital clock at the second frequency that differs from a number of pulses that would have been produced by the digital clock at the first frequency during the timing interval;
- an excess pulse counter, communicatively coupled to the clock control circuit, the constant timing reference, and the digital clock, the excess pulse counter determining a number of pulses produced by the digital clock at the second frequency that differs from the number of pulses that would have been produced by the digital clock at the first frequency during the timing interval; and
- an output phase correction circuit, communicatively coupled to the digital clock, the excess pulse counter, and the clock control circuit, the output phase correction circuit removing, in response to the clock control circuit commanding the digital clock to change from producing an output at the second frequency to producing an output at the first frequency, the number of pulses from the output that were counted by the excess pulse counter.

15. The digital clock generation circuit of claim 14, further comprising a digital signal processing circuit including at least one circuit operating at a first frequency and at least one circuit operating at a second frequency, wherein the at least one circuit operating at the first frequency processes wideband code division multiple access (WCDMA) signals and the at least one circuit operating at the second frequency processes general system for mobile (GSM) signals.

16. The digital clock generation circuit of claim 15, wherein operation of the at least one circuit at the first frequency is temporarily interrupted in order to operate the at least one circuit at the second frequency to temporarily process GSM signals.

* * * * *

UNITED STATES PATENT AND TRADEMARK OFFICE
CERTIFICATE OF CORRECTION

PATENT NO. : 7,756,231 B2  Page 1 of 1
APPLICATION NO. : 11/621420
DATED : July 13, 2010
INVENTOR(S) : Emilio J. Quiroga It is certified that error appears in the above-identified patent and that said Letters Patent is hereby corrected as shown below:

Col. 13, in claim 12, line 12:

"he" should be changed to --the--.

Col. 13, in claim 12, line 14:

after "response", insert --to--.

Col. 13, claim 12, lines 12-20 should appear as follows:

12. The method of claim 11, wherein the determining the number of pulses comprises:
        incrementing a counter in response to a pulse produced by
            the fixed frequency output and setting the output to the
            second frequency, and
        decrementing the counter in response to the setting the
            output to the first frequency and determining that the
            counter has a non-zero count.

Signed and Sealed this

Seventeenth Day of August, 2010

David J. Kappos
*Director of the United States Patent and Trademark Office*